United States Patent
Mirgorodski et al.

(10) Patent No.: US 6,903,978 B1
(45) Date of Patent: Jun. 7, 2005

(54) METHOD OF PMOS STACKED-GATE MEMORY CELL PROGRAMMING ENHANCEMENT UTILIZING STAIR-LIKE PULSES OF CONTROL GATE VOLTAGE

(75) Inventors: Yuri Mirgorodski, Sunnyvale, CA (US); Vladislav Vashchenko, Palo Alto, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 86 days.

(21) Appl. No.: 10/664,469

(22) Filed: Sep. 17, 2003

(51) Int. Cl.⁷ .............................................. G11C 16/04

(52) U.S. Cl. ............................. 365/185.28; 365/185.19; 365/185.14

(58) Field of Search ...................... 365/185.28, 185.19, 365/185.14, 185.26, 185.18

(56) References Cited

U.S. PATENT DOCUMENTS

| | | | |
|---|---|---|---|
| 4,698,787 A | 10/1987 | Mukherjee et al. | 365/185 |
| 6,714,456 B1 * | 3/2004 | Ogura et al. | 365/185.28 |

* cited by examiner

*Primary Examiner*—David Lam
(74) *Attorney, Agent, or Firm*—Stallman & Pollock LLP

(57) ABSTRACT

A method of programming a PMOS stacked gate memory cell is provided that utilizes a sequence of control gate pulses to obtain the desired potential on the floating gate.

7 Claims, 2 Drawing Sheets

METHOD OF PMOS STACKED-GATE MEMORY CELL PROGRAMMING ENHANCEMENT UTILIZING STAIR-LIKE PULSES OF CONTROL GATE VOLTAGE

TECHNICAL FIELD

The present invention is directed to a method of programming a PMOS stacked-gate memory cell by a hot electron injection mechanism that utilizes a sequence of stair-like pulses of control gate voltage.

DESCRIPTION OF THE INVENTION

Hot electron injection is a well-known and widely used method of programming non-volatile memory (NVM) cells. It is a common programming mechanism for stacked-gate cells, split-gate cells and other currently available NVM cells.

Figure 1:
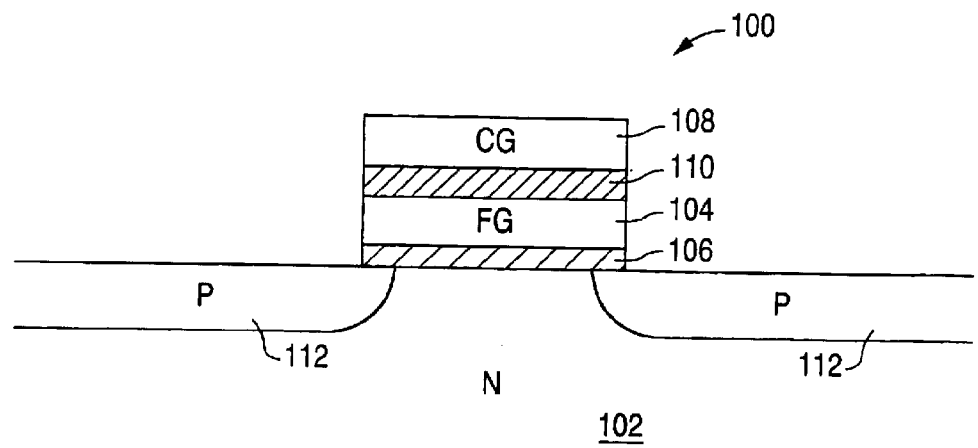
FIG. 1 is a partial cross-section drawing illustrating the general structure of a PMOS stacked gate memory cell.

FIG. 1 provides a general schematic representation of a conventional PMOS stacked gate NVM cell 100 formed in an N-type region 102 of semiconductor material, e.g. crystalline silicon. Those skilled in the art will appreciate that the N-type region 102 is typically an n-well formed in a P-type silicon substrate. The PMOS device 100 includes a conductive floating gate (FG) electrode 104, e.g. polysilicon, that is separated from the N-type region 102 by a layer of thin gate dielectric material 106, e.g. silicon dioxide. A control gate (CG) electrode 108, e.g. polysilicon, is separated from the floating gate 104 by a layer of intergate dielectric material 110, e.g. an oxide-nitride-oxide (ONO) sandwich. P-type diffusion regions 112 formed at the sides of the stacked gate structure provide the source/drain regions of the PMOS cell 100 and define an N-type channel region therebetween. The fabrication techniques available for making the PMOS device 100 are well known.

When applied to a PMOS based stacked-gate cell 100, the hot electron injection programming method assumes that a high negative voltage is applied to the drain of the PMOS device. Depending on the erasing and coupling coefficient, a corresponding voltage is applied to control gate 108 that brings the potential of the floating gate 104 to a value that is negative, but lower in absolute value compared with drain. In these conditions, the high lateral electric field creates hot electrons, and the high perpendicular electric field helps the hot electrons to reach the floating gate 104 through the thin gate oxide 106. The injection current essentially depends on the potential of the drain and the floating gate 104; that is, the more drain voltage, the more injection.

Figure 2:
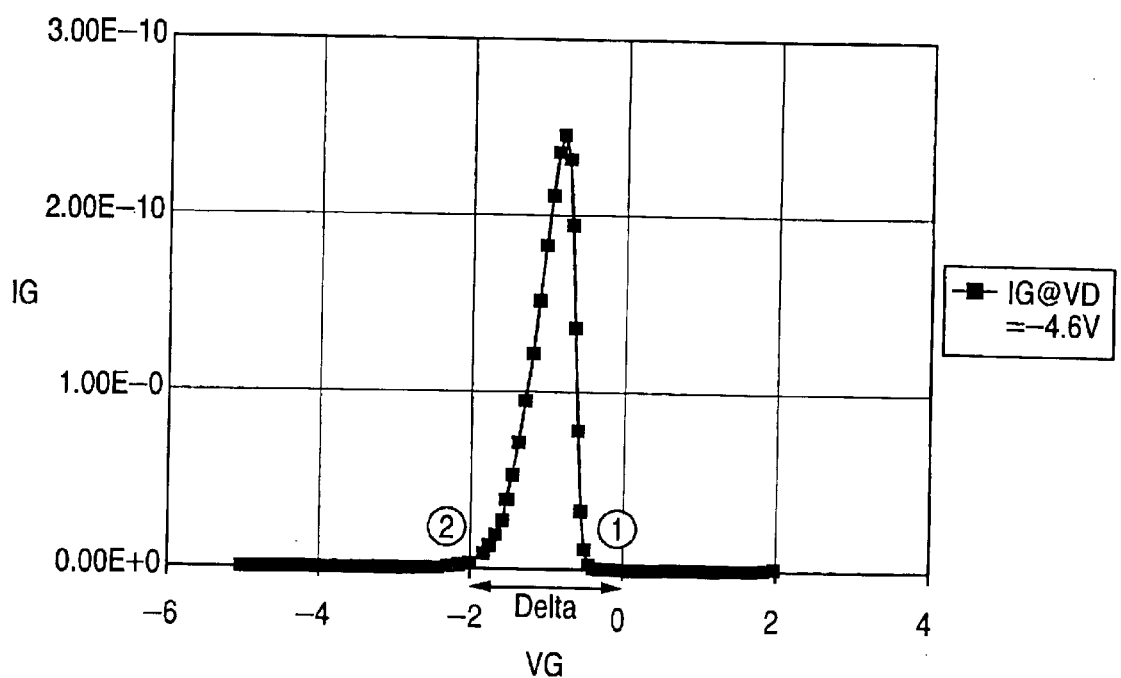
FIG. 2 is a graph showing PMOS device floating gate current versus floating gate voltage.

As shown in the FIG. 2 graph of PMOS gate current versus floating gate voltage, the gate current of the PMOS device 100 has a maximum with respect to the floating gate 104 voltage.

With continuing reference to the FIG. 2 graph, traditional programming starts from a floating gate potential that is close to the right side of the pick, i.e. position 1 on the FIG. 2 graph. During progranmming, the floating gate 104 receives a negative charge of electron injection current. As a result, the floating gate potential moves to more negative values until it stops in a position 2 on the FIG. 2 graph with very low injection current. This means the end of programming that results in a shift of the threshold voltage $V_t$ of the PMOS device 100 that is equal to the voltage difference Delta) between position 1 and position 2 on the FIG. 2 graph. This shift depends on the drain voltage via the pick's width; it does not depend on pick's height. The control gate voltage only gives a start to the programming, but does not affect $V_t$ shift.

Figure 3:
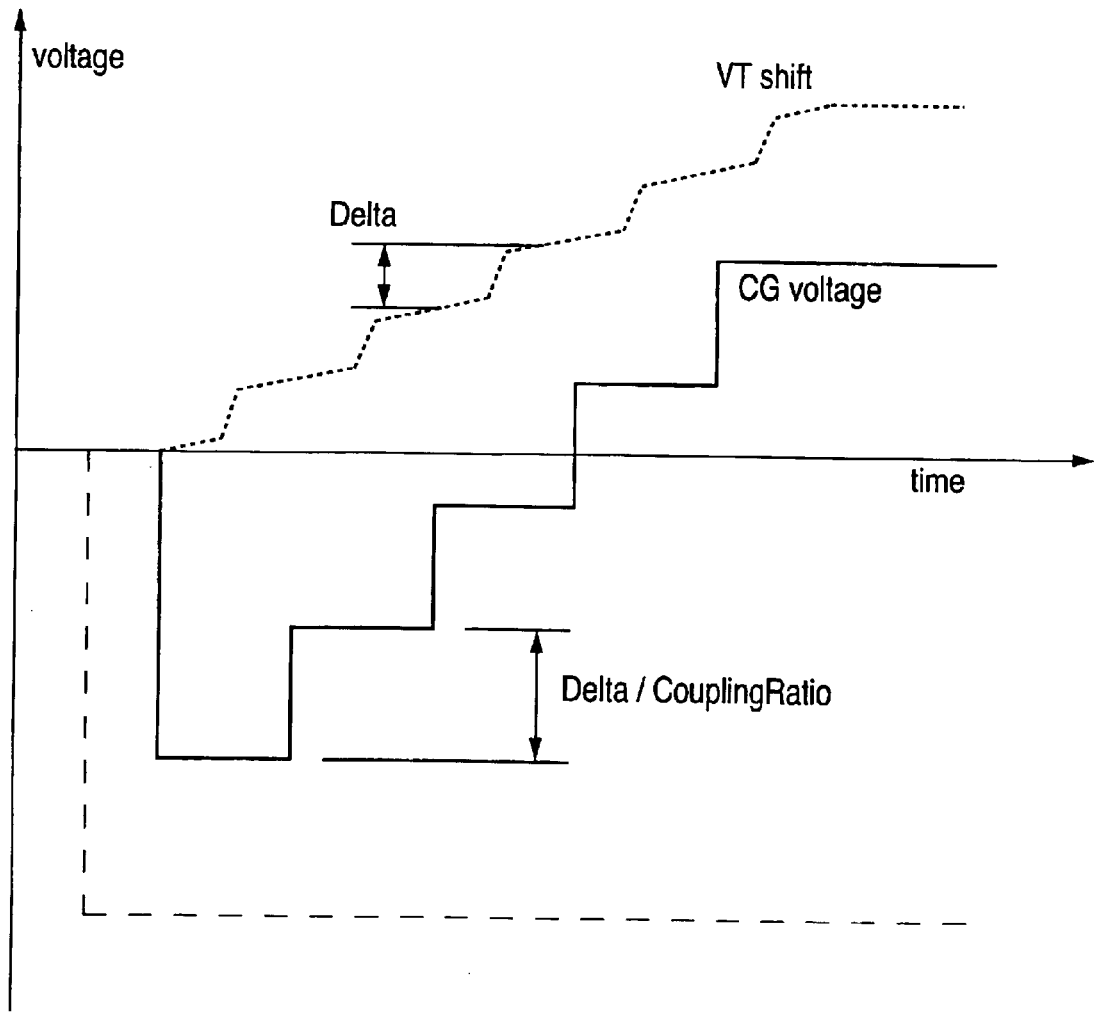
FIG. 3 is a graph showing PMOS device control gate voltage, drain voltage and Vt shift versus time.

In accordance with the present invention, the conventional hot electron injection programming procedure is repeated, each repetition bringing the floating gate potential back to the position 1 in FIG. 2 by means of a sequence of control gate pulses, as shown in FIG. 3.

The control gate pulse step up and the frequency of the pulse repetitions are important. Steps that are either too small or too large will not improve programming. In accordance with the invention, and as shown in FIG. 3, the control gate voltage pulses should have a step up that is approximately equal to Delta divided by the coupling coefficient. The time between pulses should be long enough to allow the floating gate to come to the position 2.

This method allows the programming effect to be increased by increasing only the control gate voltage with no increase in drain voltage/current. The method also offers a decrease of drain voltage/current without decreasing the programming effect.

As further shown in FIG. 3, because the control gate voltage in the programming regime is normally negative, the first few steps up do not result in any increase of supply voltage. If the control gate voltage rises to positive values, it becomes necessary to increase the supply voltage.

In accordance with the concepts of the invention, a corresponding delay circuit can be provided that produces an optimal control gate voltage increase during the programming operation. Thus, the shape of the control gate voltage pulse can be measured and implemented according to process development results or using laser trimming.

Although only specific embodiments of the present invention are shown and described herein, the invention is not to be limited by these embodiments. Rather, the scope of the invention is to be defined by these descriptions taken together with the attached claims and their equivalents.

What is claimed is:

1. A method of programming a PMOS stacked-gate memory cell, wherein the memory cell includes a p-type source region formed in n-type semiconductor material, a p-type drain region formed in the n-type semiconductor material and spaced-apart from the p-type source region to define a substrate channel region therebetween, a conductive floating gate electrode formed over the substrate channel region and separated therefrom by gate dielectric material, and a conductive control gate electrode formed over the floating gate electrode and separated therefrom by intergrate dielectric material, the programming method comprising:

(a) applying a negative voltage potential to the p-type drain region;

(b) applying a voltage pulse to the control gate electrode such that electrons are attached to the floating gate electrode from the p-type drain region through the gate dielectric material;

(c) repeating step (b) above to provide a sequence of voltage pulses to the control gate electrode such that sufficient electrons are attached to the floating gate electrode to bring the floating gate electrode from an initial voltage potential to a selected voltage potential that is negative and lower in absolute value than the negative voltage potential applied to the p-type drain region.

2. A programming method as in claim 1, and wherein a coupling coefficient exists between the floating gate electrode and the control gate electrode, and wherein the step up in each pulse in the sequence of voltage pulses provided to the control gate is approximately equal to the difference between the initial voltage potential and the selected voltage potential of the floating gate electrode divided by the coupling coefficient.

3. A programming method as in claim 2, and wherein the time between the voltage pulses applied to the control gate electrode is sufficient to allow the floating gate electrode to come to the selected voltage potential.

4. The programming method of claim 1, and wherein the semiconductor material is n-type silicon.

5. The programming method of claim 4, and wherein the gate dielectric material is silicon dioxide.

6. The programming method of claim 5, and wherein the floating gate electrode is polysilicon.

7. The programming method of claim 6, and wherein the control gate electrode is polysilicon.

* * * * *